(12) United States Patent
Shively

(10) Patent No.: US 6,473,891 B1
(45) Date of Patent: Oct. 29, 2002

(54) WIRE ROUTING TO CONTROL SKEW

(75) Inventor: John Shively, Benicia, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/564,062

(22) Filed: May 3, 2000

(51) Int. Cl.[7] .............................................. G06F 17/50

(52) U.S. Cl. ............................... 716/12; 716/6; 716/10

(58) Field of Search .......................... 716/1–21; 703/1–2

(56) References Cited

U.S. PATENT DOCUMENTS

| | | | | |
|---|---|---|---|---|
| 4,805,113 A | * | 2/1989 | Ishii et al. ...................... | 716/10 |
| 5,340,772 A | * | 8/1994 | Rosotker ....................... | 438/460 |
| 5,341,024 A | * | 8/1994 | Rosotker ....................... | 257/620 |
| 5,532,934 A | * | 7/1996 | Rostoker ....................... | 716/10 |
| 5,568,636 A | * | 10/1996 | Koford ............................ | 716/9 |
| 5,822,214 A | * | 10/1998 | Rostoker et al. ............... | 716/10 |
| 5,831,459 A | * | 11/1998 | McDonald .................... | 327/141 |

OTHER PUBLICATIONS

Tan et al. ("Improvement on the diagonal routing model", IEE Proceedings on Circuits, Devices and Systems, vol. 141, No. 6, Dec. 1994, pp. 535–536).*

Chen et al. ("Addressing, routing, and broadcasting in hexagonal mesh multiprocessors", IEEE Transactions on Computers, vol. 39, No. 1, Jan. 1990, pp. 10–18).*

Peir et al. ("Designing 3–D optical dilation multistage interconnection networks", Proceedings of 3rd Symposium on the Frontiers of Massively Parallel Computation, Oct. 8, 1990, pp. 352–357).*

* cited by examiner

*Primary Examiner*—Vuthe Siek
*Assistant Examiner*—Phallaka Kik
(74) *Attorney, Agent, or Firm*—Mitchell, Silberberg & Knupp, LLP

(57) ABSTRACT

The present invention is directed to laying out connection points and routing a signal from an input terminal to the connection points for use in signal distribution to control skew. A pattern of diamond-shaped rings is constructed, each of the diamond-shaped rings including an inner diamond, an outer diamond and all space between the inner diamond and the outer diamond, where the diamond-shaped rings are arranged such that each point within a specified area is included within at least one diamond-shaped ring. A center point is identified for each of the diamond-shaped rings and each center point is designated as a connection point. A connection is then routed between the input terminal and each of plural of the connection points. The invention also is directed to routing a signal from one of plural connection points to a pin so as to control skew. A diamond-shaped ring is associated with each connection point, the diamond-shaped ring including an inner diamond, an outer diamond and all space between the inner diamond and the outer diamond, where the inner diamond and the outer diamond have a common center which is the connection point associated with the diamond-shaped ring. It is then determined which of the diamond-shaped rings include the pin. Finally, a connection is routed between the pin and the connection point associated with one of the diamond-shaped rings that includes the pin.

32 Claims, 4 Drawing Sheets

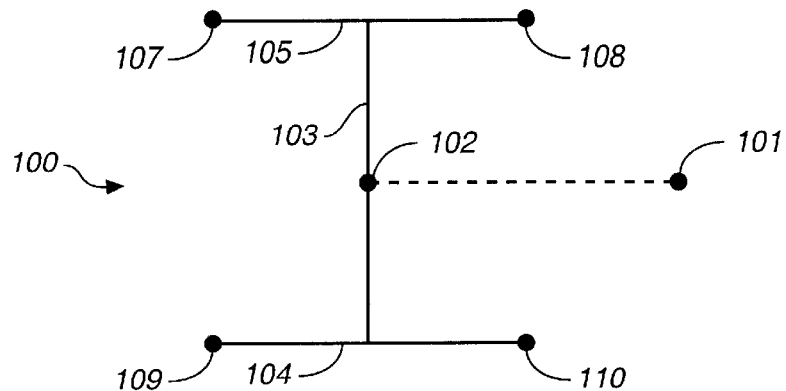
FIG._1
*(PRIOR ART)*
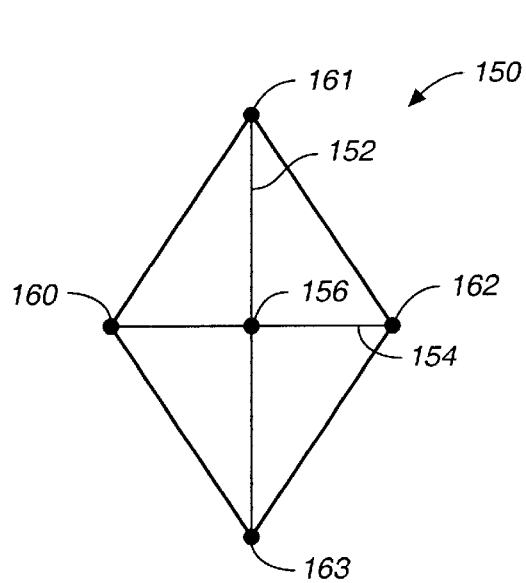 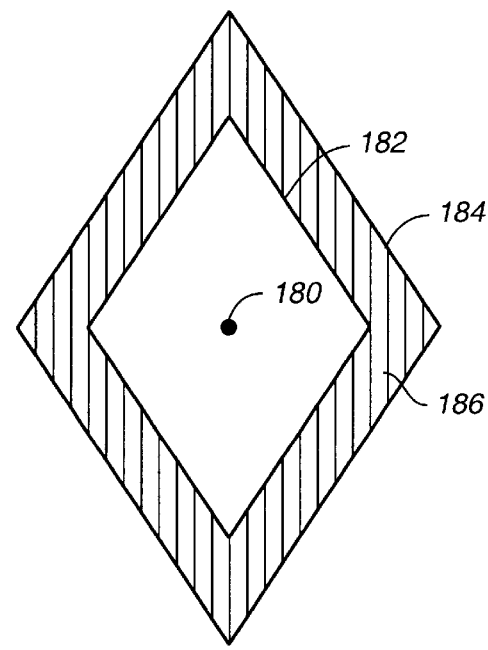
FIG._2A  FIG._2B

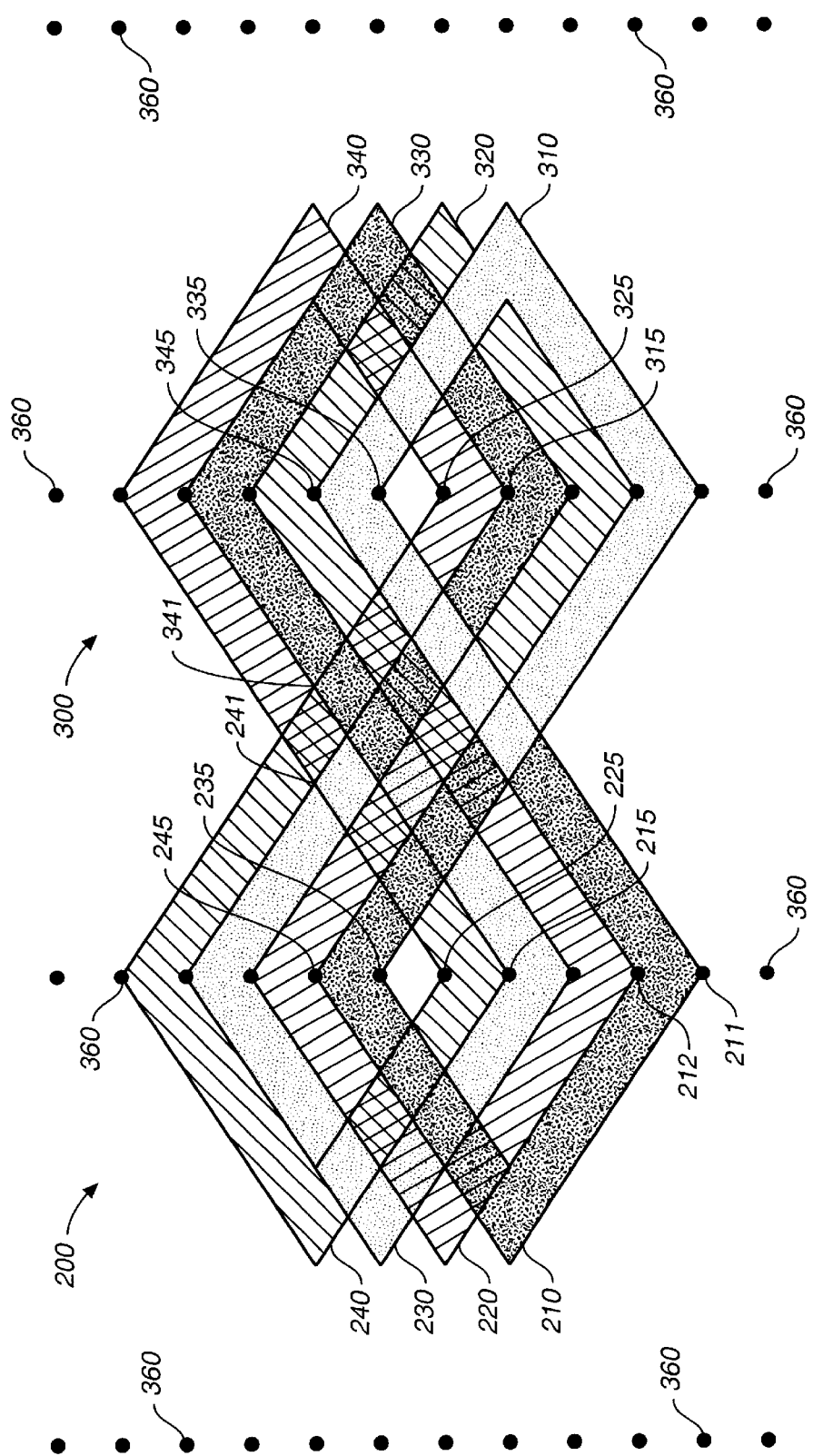
FIG._3

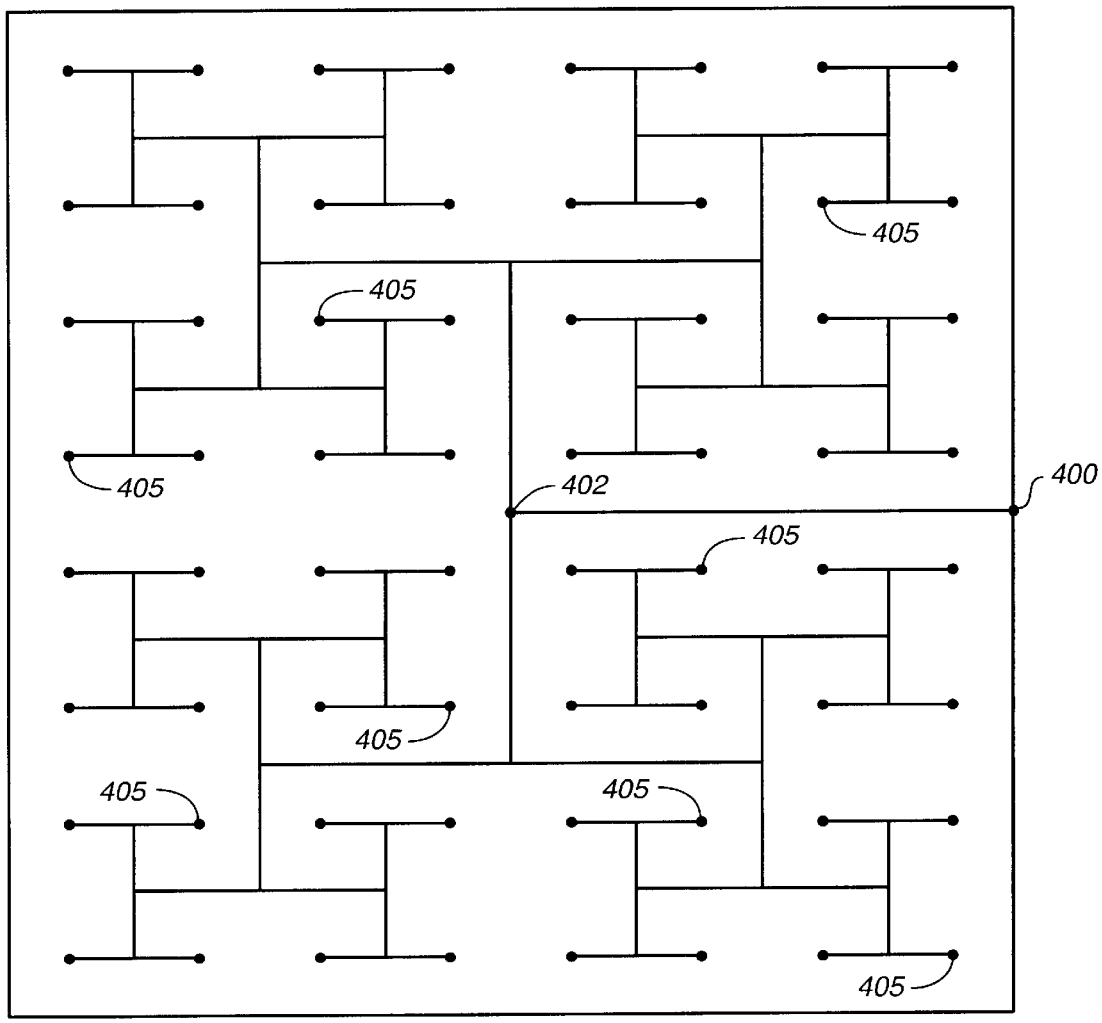
FIG._4

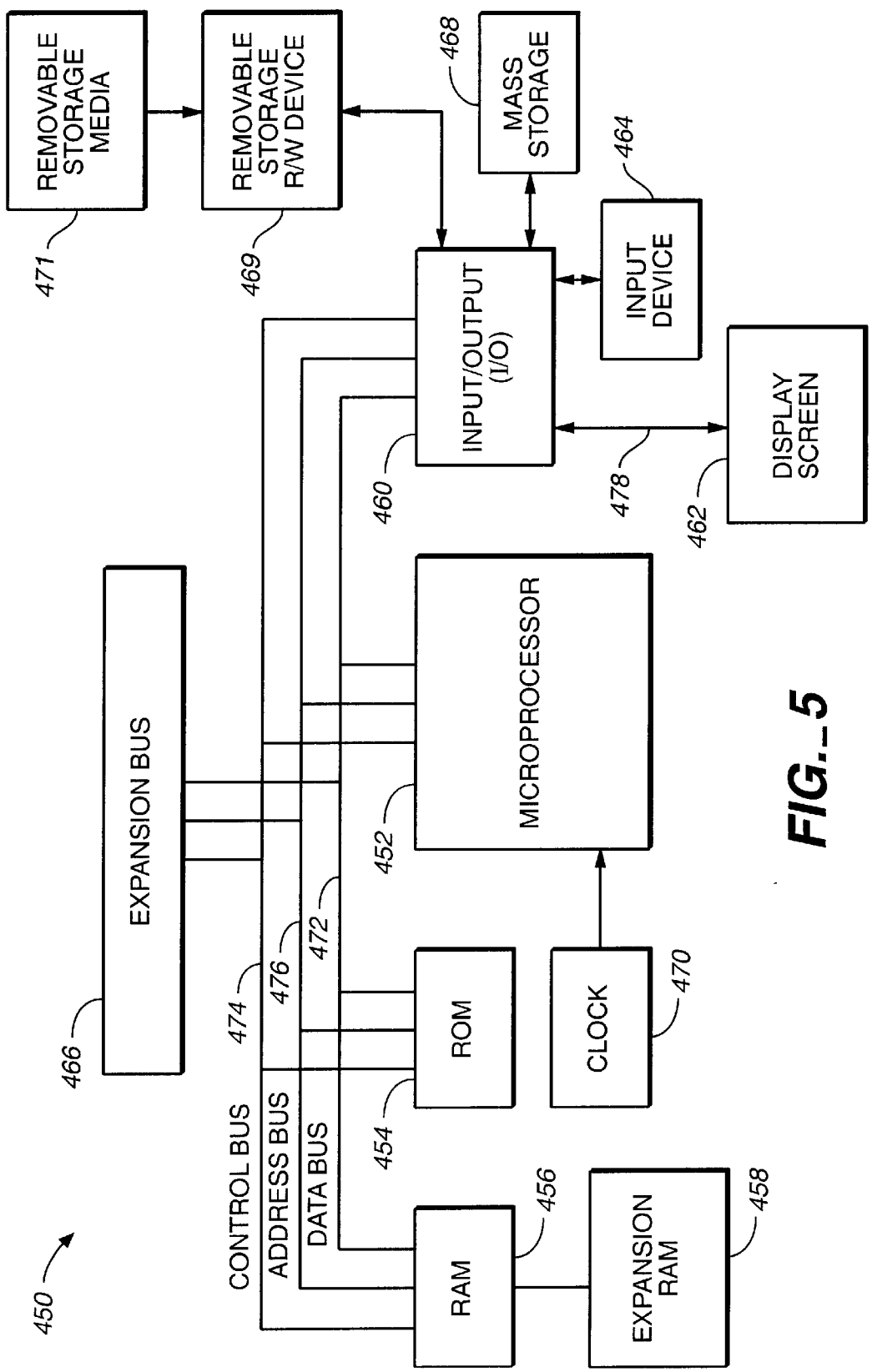

WIRE ROUTING TO CONTROL SKEW

BACKGROUND OF THE INVENTION

1. Field of the Invention

The present invention concerns wire routing to control skew, and particularly relates to wire routing during integrated circuit (IC) design.

2. Description of the Related Art

"Routing" in semiconductor fabrication involves determining wiring paths between elements on the surface of an integrated circuit. As is described more fully below, certain signals, such as clock signals, require special attention during the routing process. In particular, it is desirable to have a clock signal reach all the functional elements to which the clock signal is routed at the same time. This generally allows a higher clock frequency, which in turn generally increases the performance of the integrated circuit. As is described more fully herein, the present invention relates to signal routing, particularly clock signal routing during integrated circuit design.

Integrated Circuit Basics

An integrated circuit chip (or die) includes electronic components formed on a surface of a semiconductor substrate and also includes connections between those components.

A cell is a group of one or more circuit elements such as transistors, capacitors, and other basic circuit elements grouped to perform a function. Each of the cells of an IC may have one or more pins, each of which, in turn, may be connected to one or more other pins of the IC by electrically conductive traces (or wires). The wires connecting the pins of the IC typically are formed on the metal layers of the chip, which in turn are formed on top of the chip's semiconductor substrate.

A net is a set of two or more pins which must be connected, thus connecting the logic circuits having the pins. Because a typical chip has thousands, tens of thousands, or hundreds of thousands of pins that must be connected in various combinations, the chip generally also includes definitions of thousands, tens of thousands, or hundreds of thousands of nets, or sets of pins. The number of the nets for a chip is typically on the same order as the order of the number of cells on the chip. Commonly, a majority of the nets include only two pins to be connected; however, many nets include three or more pins. Some nets may include hundreds, thousands or tens of thousands of pins to be connected. A netlist is a list of nets including names of connected pins or a list of cells including names of nets that connect to pins of cells. Clock nets typically have around 100,000 pins.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps.

The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time, and enhanced chip performance.

The objective of physical design is to determine an optimal arrangement of devices in a plane or in a three dimensional space, and an efficient interconnection or routing scheme between the devices to obtain the desired functionality.

The input to the physical design problem is a circuit diagram, and the output is the layout of the circuit. This is accomplished in several stages including partitioning, floor planning, placement, routing and compaction.

As noted above, a chip may contain several million transistors. Layout of the entire circuit cannot be handled due to the limitation of memory space as well as the computation power available. Therefore the circuit is normally partitioned by grouping components into blocks, such as subcircuits and modules. The actual partitioning process considers many factors such as the size of the blocks, number of blocks and number of interconnections between the blocks.

The output of partitioning is a set of blocks, along with the interconnections required between blocks. As noted above, the set of required interconnections is the netlist. In large circuits, the partitioning process is often hierarchical, although non-hierarchical (e.g. flat) processes can be used, and at the topmost level a circuit can have between 5 and 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and also specifying, for example, a particular grid on which to route each wire. Detailed routing includes channel routing and switch box routing.

Compaction is the task of compressing the layout in all directions such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication process are violated.

Upon completion of physical design, the IC chip is fabricated using the information generated during physical design. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Zero-Skew Routing of Clock Nets

The performance of an IC generally is proportional to clock frequency. Maximum clock frequency, in turn, typically is limited by the maximum variation in clock delay to the different functional units implemented on the chip. Accordingly, it is preferable that the clock signal arrive at all functional units at as close to the same time as possible. In order to attain this goal, clock nets in very large scale integration systems generally require special attention with respect to routing.

The maximum difference in the arrival time of a signal at any two different components is called "skew." Thus, the goal in routing clock nets is to achieve as close to "zero skew" as is possible.

Accordingly, the chip designer is faced with the following problem: Given a clock signal input terminal and a number of clock pins (usually attached to flip-flops) distributed arbitrarily on a chip, find a route from the clock signal input terminal to each of the clock pins such that the delay to each of the clock pins (due mainly to the parasitic capacitances of the wires) is within some pre-defined range, or alternatively, skew (which is defined to be the difference between the largest delay and the smallest delay) is limited to a pre-defined amount.

The classical zero-skew routing of Tsay builds a zero-skew bottom-up tree, by choosing two pins under which the skew is zero, merging them by routing, and then finding a balance point (which will be the new tapping point) from which delays to all the bottom level flip-flops below this balance point are the same. Tsay's technique is described in his article "Exact Zero Skew", IEEE, pp. 336–339, 1991. However, in many cases, Tsay's balance point does not exist because the delay below one of the pins to be merged is much larger than that of the other. Therefore, enough wire is added in the route so that the delays are equal if the tapping point is placed at the pin with the larger delay to all its bottom level pins. It is noted that Tsay uses the Elmore delay model, which is described in Elmore's article "The Transient Response of Damped Linear Networks with Particular Regard to Wideband Amplifiers", Journal of Applied Physics, Volume 19, pp. 55-63, January 1948.

Although Tsay's approach theoretically can be carried out all the way up to the clock signal input terminal, certain practical considerations obviate its implementation. Electrical considerations imply that the clock signal input terminal will be inputting a relatively large amount of current, and hence the wire coming out of the input terminal needs to be very thick to handle such heavy currents. Therefore, trying to do Tsay's zero skew route all the way to the top often fails due to lack of routing resources. In particular, routing very thick wires at the top level becomes problematic due to interference with wires already routed.

For this reason, some space (a pre-route) is normally reserved which is used for routing at the top level to the signal input terminal. For symmetry, this pre-route is generally an H-trunk, whose middle wire and legs are much thicker than the wires that are used for lower level zero-skew routing, and the clock signal input terminal then connects to the center of the middle wire.

This is shown in FIG. 1. Referring to FIG. 1, H-trunk 100 includes a top segment 105, a middle segment 103 and a bottom segment 104. The input terminal 101 connects to the center 102 of the middle segment 103. Due to the symmetry of the H-trunk 100, the signal delay to points 107, 108, 109 and 110 is theoretically identical (zero skew). An H-trunk therefore can effectively generate 4 symmetrically arranged zero-skew points (such as points 107 to 110) from a single zero skew point (such as point 101 or 102). Accordingly, utilizing the H-trunk depicted in FIG. 1, Tsay's algorithm can be applied to each quadrant of the chip surface, with the highest level connection in each quadrant being made to the appropriate one of points 107 to 110.

However, conventional clock signal routing techniques such as Tsay's have certain disadvantages. First, constructing a zero-skew tree in this manner can require a significant amount of processing time. Moreover, because Tsay's tree is constructed from the bottom up, subsequent movement of clock pins may require extensive changes to the tree structure, further complicating the design process. Finally, techniques such as Tsay's often require adding large amounts of wire in order to ensure that balance points can be obtained at each level.

Other conventional approaches also have been proposed. In one such technique, a region is identified where delay falls within certain predetermined limits, and then pin placement is constrained to fall within that region. Such a technique is described in Ogawa, et al. "Efficient Placement Algorithms Optimizing Delay For High-Speed ECL Masterslice LSI's", Proceeding of the $23^{rd}$ Design Automation Conference, pp. 404-410, 1986. Techniques such as Ogawa's also have disadvantages. For instance, in order to use such techniques, the number of locations where pins may be placed is limited. However, in most conventional IC design, placement precedes routing. Thus, to the extent that the placement required by Ogawa's routing technique is not satisfied, placement improvement must be performed. This can have the effect of further complicating the IC design process.

SUMMARY OF THE INVENTION

The present invention addresses the foregoing problems by identifying and routing to a number of connection points using a pattern of diamond-shaped rings.

Thus, according to one aspect, the invention is directed to laying out connection points and routing a signal from an input terminal to the connection points, for use in signal distribution to control skew. A pattern of diamond-shaped rings is constructed, each of the diamond-shaped rings including an inner diamond, an outer diamond and all space between the inner diamond and the outer diamond, where the diamond-shaped rings are arranged such that each point within a specified area is included within at least one diamond-shaped ring. A center point is identified for each of the diamond-shaped rings and each center point is designated as a connection point. A connection is then routed between the input terminal and each of plural of the connection points.

By identifying and routing connections to a number of connection points in the foregoing manner, the present invention frequently can facilitate controlled skew routing to arbitrarily arranged pins. Moreover, connections to such connection points often can be pre-routed, thereby further facilitating a particular routing design.

The present invention also addresses the problems described above by associating a diamond-shaped ring with each of several connection points and routing a connection between a pin and the connection point associated with one of the diamond-shaped rings that include the pin.

Thus, according to a further aspect, the invention is directed to routing a signal from one of plural connection points to a pin so as to control skew. A diamond-shaped ring is associated with each connection point, the diamond-shaped ring including an inner diamond, an outer diamond and all space between the inner diamond and the outer diamond, where the inner diamond and the outer diamond have a common center which is the connection point associated with the diamond-shaped ring. It is then determined which of the diamond-shaped rings include the pin. Finally, a connection is routed between the pin and the connection point associated with one of the diamond-shaped rings that includes the pin.

Routing a signal between such a connection point and a pin in the foregoing manner often can be accomplished in a relatively simple manner, while at the same time controlling skew.

According to a still further aspect, the invention is directed to routing a signal from an input terminal to a pin so as to control skew. A pattern of diamond-shaped rings is constructed, each of the diamond-shaped rings including an inner diamond, an outer diamond and all space between the inner diamond and the outer diamond, where the diamond-shaped rings are arranged such that each point within a specified area is included within at least one diamond-shaped ring. A center point is then identified for each of the diamond-shaped rings and each center point is designated as a connection point. A nearly zero-skew connection is routed between the input terminal and each of plural of the connection points, and it is determined which of the diamond-shaped rings include the pin. A connection is routed between the pin and the connection point associated with one of the diamond-shaped rings that includes the pin. It is a feature of this aspect of the invention that the pattern includes an arrangement of diamond-shaped rings such that the center points for the diamond-shaped rings are equally spaced in the horizontal direction and are equally spaced in the vertical direction.

The foregoing arrangement frequently can provide routing from an input terminal to a pin which both is relatively easy to implement and can be used to control skew. Such a routing technique is particularly applicable to clock signal routing on an integrated circuit chip.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 depicts an H-trunk for generating four symmetrical zero-skew points from a single zero-skew point.

FIGS. 2A and 2B illustrate a diamond and a diamond-shaped ring, respectively.

FIG. 3 illustrates an array of diamond-shaped rings according to a preferred embodiment of the invention.

FIG. 4 illustrates on example of distributing a signal to the centers of diamond-shaped rings using nested H-trunks.

FIG. 5 is a block diagram of a general purpose computer system, representing one suitable computer platform for implementing the methods of the invention.

DETAILED DESCRIPTION OF THE PREFERRED EMBODIMENTS

The present invention provides a technique for routing a signal with controlled skew by generating a set of connection points and routing from those connection points to individual pins, as discussed in more detail below. Initially, certain concepts underlying the present invention are described.

Wire Routing

It is first necessary to understand certain basic concepts of wire routing. When routing wires on an integrated circuit chip, the wire segments generally are constrained to be either completely horizontal or completely vertical. Adopting this convention, the distance between any two points $(x_1, y_1)$ and $(x_2, y_2)$ is $$|x1-x2|+|y1-y2|.$$

The foregoing distance measure is referred to as the "Manhattan distance" between two points. The "delay distance" between two points $(x_1, y_1)$ and $(x_2, y_2)$ is specified as $$h*|x1-x2|+v*|y1-y2|.$$

where h is a horizontal delay factor and v is a vertical delay factor. The delay factors h and v may be expressed as delay per unit length for a standard width wire in the horizontal and vertical directions, respectively. The delay distance thus actually specifies an amount of delay based on routing distance.

The distance delay is used, for example, where wire load characteristics are different in the horizontal and vertical directions. This is frequently the case because horizontal and vertical wires are typically implemented on different metal layers of the integrated circuit. Thus, for example, certain metal layers are designated as horizontal metal layers and other metal layers are designated as vertical metal layers. The h and v factors therefore account for variations in the parasitic capacitances and resistances of the different metal layers. It should also be noted that, in addition to specifying a separate horizontal and vertical delay factor, it also may be desirable to have a separate delay factor for each metal layer. Accordingly, in the case of a four metal layer IC, it may be desirable to specify $h_1$, $h_2$, $v_1$ and $v_2$.

Diamonds and Diamond-Shaped Rings

A "diamond" is a quadrilateral with all four sides equal in length and with opposite angles equal. The mathematical term for a diamond is a rhombus. An example of a diamond is illustrated in FIG. 2A.

The "length" of the diamond is the longest distance between opposite corners. The "width" of the diamond is the shortest distance between opposite corners. Accordingly, diamond 150, which has corners 160 to 163, has length 152 and width 154.

The "area" of a diamond is one-half the length times the width, which also is one-half the area of the enclosing rectangle. A diamond has a "center" where the length and width lines intersect. Thus, diamond 150 has center 156.

Diamonds are "similar" if their length-to-width ratios are the same. Thus, similar diamonds have the same shape, but not necessarily the same size.

In view of the foregoing concepts, it can be shown that all points on the boundary of a diamond have the same delay distance from the center of the diamond if the horizontal-to-vertical dimension ratio of the diamond is v/h. As a result, all of the points which have a delay distance of not less than a and not greater than b from a given point O can be specified as the area between an inner diamond and an outer diamond whose centers are the point O.

An example is illustrated in FIG. 2B. In FIG. 2B, diamonds 182 and 184 are similar, each having a horizontal-to-vertical dimension ratio of v/h. In addition, diamonds 182 and 184 have the same center point, which is point 180. Accordingly, the delay distance from point 180 to any point on diamond 182 is a constant delay a. Similarly, the delay distance from point 180 to any point on diamond 184 is a constant delay b, where b>a. Finally, the delay distance from point 180 to any point within area 186 between diamonds 182 and 184 will be a delay d, where a<d<b.

An inner diamond and outer diamond, together with the area between the two, collectively is referred to herein as a "diamond-shaped ring". As can be seen from the foregoing example, varying the width of the diamond-shaped ring will control the maximum amount of delay differential, or skew, from the center point.

Routing With Controlled Skew

A routing technique according to a preferred embodiment of the invention will now be described with reference to FIG. 3. FIG. 3 depicts an array of diamond-shaped rings consisting of two columns 200 and 300, each consisting of four overlapping diamonds. Specifically, column 200 includes diamond-shaped rings 210, 220, 230 and 240; similarly, column 300 includes diamond-shaped rings 310, 320, 330 and 340.

As shown in FIG. 3, the inner and outer diamonds making up each of the diamond-shaped rings is similar to each other, each having a horizontal-to-vertical dimension ratio of v/h. Moreover, each diamond-shaped ring has the same size as the other diamond-shaped rings. That is, all of the inner diamonds are identical in size and shape and all of the outer diamonds are identical in size and shape.

Also as shown in FIG. 3, the lower corner of the outer diamond for each of the diamond-shaped rings is the same as the lower corner of the inner diamond of the diamond-shaped ring immediately below it. In other words, each of the diamond-shaped rings in a column can be formed by shifting one of the other diamond-shaped rings in the column. For example, diamond-shaped ring 220 can be formed by shifting diamond-shaped ring 210 upward a distance equal to the distance between outer diamond lower corner 211 and inner diamond lower corner 212. Thus, point 212 is both the inner diamond lower corner for diamond-shaped ring 210 and the outer diamond lower corner for diamond-shaped ring 220. Diamond-shaped ring 220 can be shifted upward the same distance to obtain diamond-shaped ring 230, and diamond-shaped ring 230 can be shifted upward the same distance to generate diamond-shaped ring 240. Diamond-shaped rings 310, 320, 330 and 340 can be formed in the same manner.

In the preferred embodiment, each diamond-shaped ring is vertically aligned with another diamond-shaped ring in another column. Thus, diamond-shaped rings 240 and 340 are vertically aligned; diamond-shaped rings 230 and 330 are vertically aligned; diamond-shaped rings 220 and 320 are vertically aligned; and diamond-shaped rings 210 and 310 are vertically aligned.

Also in the preferred embodiment, the columns are arranged so that the corners of vertically aligned diamond-shaped rings overlap. More preferably, an outer diamond corner of one of the diamond-shaped rings is the same as the inner diamond corner of a diamond-shaped ring which is vertically aligned with and horizontally adjacent to the first diamond-shaped ring. This is illustrated in FIG. 3. For instance, point 241 is both the outer diamond left corner of diamond-shaped ring 340 and the inner diamond right corner of diamond-shaped ring 240. Similarly, point 341 is both the outer diamond right corner of diamond-shaped ring 240 and the inner diamond left corner of diamond-shaped ring 340.

The pattern depicted in FIG. 3 can be extended in either or both of the horizontal and vertical directions so as to cover as large an area as desired. Using the arrangement show in FIG. 3, each point within the desired area is included within exactly two diamond-shaped rings, other than certain points near the edges of the pattern.

When diamond-shaped rings are arranged as shown in FIG. 3, the centers of the diamond-shaped rings lie in a two-dimensional regularly spaced rectangular grid. Thus, diamond-shaped rings 210, 220, 230, 240, 310, 320, 330 and 340 have centers 215, 225, 235, 245, 315, 325, 335 and 345 respectively. Centers 215, 225, 235 and 245 lie along a single line; and centers 315, 325, 335 and 345 lie along a different line. Moreover, the distance between any two vertically adjacent centers is constant; similarly, the distance between any two horizontally adjacent centers is constant. Thus, the distance between centers 235 and 245 is the same as the distance between centers 215 and 225. Similarly, the distance between centers 215 and 315 is the same as the distance between centers 245 and 345.

Extending the pattern of diamond-shaped rings shown in FIG. 3 results in the two-dimensional regularly spaced rectangular grid of center points shown in FIG. 3. Examples of these additional center points include points 360.

While the foregoing pattern of diamond-shaped rings is preferable, other patterns are also possible. However, whatever pattern is used, it is preferable that the diamond-shaped rings are arranged such that each point in a specified predetermined area is included within at least one diamond-shaped ring.

Having constructed a pattern of diamond-shaped rings which covers the desired area, routing from an input signal terminal (such as a clock signal input terminal) to any particular point within the area where a pin is located can be seen as involving a two-step process: first, the signal is routed from the pin to the center of a diamond-shaped ring that includes the pin; second, the signal is routed from the input terminal to that center point.

With regard to the first step, when the diamond-shaped rings that include the pin have been identified and the centers of the those diamond-shaped rings located, a connection can be routed from the pin to any of those center points. The selection as to which center point to use when more than one have been identified can be made based on any of various criteria. For example, the center point for which routing congestion is likely to minimized might be selected. The actual routing from the pin to the center point preferably should then satisfy the minimum Manhattan distance between the pin and the chosen center point (i.e., routing only in one direction in each dimension, with no detours).

The second step of routing from the input terminal to the required center points can be accomplished in any of a number of ways. Preferably, connections are routed to all such center points. Also, in the preferred embodiment, routing to these center points is completed with zero or near zero skew (referred to as zero-skew routing). As a result, nearly the entire skew from the input terminal to any pin is solely a function of the width of the diamond-shaped ring used.

Because the center points are arranged in a regularly spaced array in the preferred embodiment, zero-skew routing to those points is fairly straightforward. One example utilizing nested H-trunks is illustrated in FIG. 4.

Specifically, FIG. 4 illustrates a nested H-trunk structure in which the input signal (such as a clock signal) is provided at input terminal 400. The signal is then routed to the center point 402 of the main H-trunk. Each branch of the main H-trunk then feeds a second-level H-trunk. For illustration purposes, the structure shown in FIG. 4 includes only three levels of nested H-trunks. However, any other number of levels may be used, as is necessary. Utilizing such a structure, a regularly-spaced array of zero-skew points 405 are created. Moreover, by appropriately adjusting the nested H-trunk structure, such as by changing the dimensions of the H-trunks at a particular level or omitting branches at particular levels, the zero-skew points generally can be made to coincide with the identified centers of the diamond-shaped rings.

The signal distribution technique shown in FIG. 4 is merely exemplary, and other techniques may be used, as will be apparent to those skilled in the art. In particular, due to the highly structured arrangement of the center points, and the corresponding symmetry involved, zero-skew routing to those points generally will be fairly straightforward. It is noted that in certain cases some of the center points may not be needed; therefore, wire connections to these center points may be omitted.

Thus, by pre-routing to particular connection points, as specified above, wire routing with controlled skew from these connection points to individual pins generally will not be significantly more complicated than ordinary wire routing. Moreover, because the particular connection points can be arranged in a regular repeating pattern, zero-skew routing to them is often less difficult that routing to arbitrarily located pins. Still further, because the pattern can be made to cover any predetermined area, pre-routing to the particular connection points according to the invention can often be designed in advance for an entire class of IC chips, thereby significantly shortening the design time for a particular chip.

Finally, by appropriately designing the underlying diamond-shaped rings, and requiring wires from the connection points to the pins to be the shortest Manhattan distance between those points, signal delay differentials, or skew, generally can be controlled to fall within specified limits.

Design System Environment

Generally, the methods described herein with respect to IC design will be practiced with a general purpose computer, either with a single processor or multiple processors. FIG. 5 is a block diagram of a general purpose computer system, representing one of many suitable computer platforms for implementing the methods described above. FIG. 5 shows a general purpose computer system 450 in accordance with the present invention. As shown in FIG. 5, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for pre-wiring a grid of connection points from an input terminal so as to control skew, said method comprising:
   constructing a pattern of diamond-shaped rings, each of the diamond-shaped rings including an inner diamond, an outer diamond and all space between the inner diamond and the outer diamond, wherein the diamond-shaped rings are arranged such that each point within a specified area is included within at least one diamond-shaped ring;
   identifying a center point for each of the diamond-shaped rings and designating each center point as a connection point; and
   routing a connection between the input terminal and each of plural of the connection points,
   wherein the pattern comprises an arrangement of diamond-shaped rings such that the center points for the diamond-shaped rings are arranged in a grid, equally spaced in a horizontal direction and equally spaced in a vertical direction.

2. A method according to claim 1, wherein the pattern comprises a column of diamond-shaped rings that overlap, and wherein the center points for the diamond-shaped rings in the column lie on a single line.

3. A method according to claim 1, wherein a corner of one diamond-shaped ring overlaps a corner of a different diamond-shaped ring that is adjacent to and vertically aligned with the one diamond-shaped ring.

4. A method according to claim 1, wherein the inner diamond and the outer diamond for each of the diamond-shaped rings are similar to each other.

5. A method according to claim 4, wherein all of the diamond-shaped rings are identical in size and shape.

6. A method according to claim 4, wherein the inner diamond and the outer diamond for each diamond-shaped ring have a horizontal-to-vertical dimension ratio of v/h, where h is a horizontal delay factor and v is a vertical delay factor.

7. A method according to claim 4, wherein a distance between the inner diamond and the outer diamond for each of the diamond-shaped rings is determined based on a specified maximum skew.

8. A method according to claim 1, wherein a corner of the outer diamond for each of plural of the diamond-shaped rings is coincident with a corner of the inner diamond for another of the diamond-shaped rings.

9. A method according to claim 1, wherein the diamond-shaped rings are arranged such that each pin to be connected to a signal is included within exactly two diamond-shaped rings.

10. A method according to claim 1, wherein the connections between the input terminal and the connection points are made using plural nested H-trunks.

11. A method according to claim 1, further comprising:
    determining which of the diamond-shaped rings include a specified pin; and
    routing a connection between the specified pin and the connection point which is the center point of one of the diamond-shaped rings that includes the specified pin.

12. A method according to claim 1, wherein the specified area comprises all areas that include a pin to be connected to a signal.

13. A method according to claim 1, wherein the pre-wiring is for routing a clock signal.

14. A method for routing a signal from one of plural connection points to a pin so as to control skew, said method comprising:

associating a diamond-shaped ring with each connection point, thereby defining a plurality of diamond-shaped rings, wherein each diamond-shaped ring includes an inner diamond, an outer diamond and all space between the inner diamond and the outer diamond, and wherein the inner diamond and the outer diamond have a common center which is the connection point associated with the diamond-shaped ring;

determining which of the plurality of diamond-shaped rings include the pin; and routing a connection between the pin and the connection point associated with one of the diamond-shaped rings that includes the pin.

15. A method according to claim 14, wherein the connection points are arranged in a predetermined pattern.

16. A method according to claim 15, wherein the predetermined pattern comprises a sequence of equally spaced connection points lying on a single line.

17. A method according to claim 15, wherein the predetermined pattern comprises an arrangement such that the connection points are equally spaced in a horizontal direction and are equally spaced in a vertical direction.

18. A method according to claim 17, wherein a corner of one of the diamond-shaped rings overlaps a corner of another of the diamond-shaped rings that is adjacent to and vertically aligned with the one of the diamond-shaped rings.

19. A method according to claim 14, wherein a corner of the outer diamond for each of the diamond-shaped rings is coincident with a corner of the inner diamond for another of the diamond-shaped rings.

20. A method according to claim 14, wherein the connection is routed between the pin and the connection point associated with the diamond-shaped ring that includes the pin so as to satisfy a minimum Manhattan distance.

21. A method according to claim 14, wherein the inner diamond and the outer diamond for each of the diamond-shaped rings are similar to each other.

22. A method according to claim 21, wherein all of the diamond-shaped rings are identical in size and shape.

23. A method according to claim 21, wherein the inner diamond and the outer diamond for each diamond-shaped ring have a horizontal-to-vertical dimension ratio of v/h, where h is a horizontal delay factor and v is a vertical delay factor.

24. A method according to claim 21, wherein a distance between the inner diamond and the outer diamond for each of the diamond-shaped rings is determined based on a specified maximum skew.

25. A method according to claim 14, wherein each pin to be connected to the signal is included within at least one diamond-shaped ring.

26. A method according to claim 14, wherein each pin to be connected to the signal is included within exactly two diamond-shaped rings.

27. A method according to claim 14, wherein the signal is a clock signal.

28. A method for routing a signal from an input terminal to a pin so as to control skew, said method comprising:

constructing a pattern of diamond-shaped rings, each of the diamond-shaped rings including an inner diamond, an outer diamond and all space between the inner diamond and the outer diamond, wherein the diamond-shaped rings are arranged such that each point within a specified area is included within at least one diamond-shaped ring;

identifying a center point for each of the diamond-shaped rings and designating each center point as a connection point;

routing a nearly zero-skew connection between the input terminal and each of plural of the connection points;

determining which of the diamond-shaped rings include the pin; and routing a connection between the pin and the connection point associated with one of the diamond-shaped rings that includes the pin, wherein the pattern comprises an arrangement of diamond-shaped rings such that the center points for the diamond-shaped rings are equally spaced in a horizontal direction and are equally spaced in a vertical direction.

29. Computer-executable process steps, stored on a computer readable medium, for pre-wiring a grid of connection points from an input terminal so as to control skew, said process steps comprising steps to:

construct a pattern of diamond-shaped rings, each of the diamond-shaped rings including an inner diamond, an outer diamond and all space between the inner diamond and the outer diamond, wherein the diamond-shaped rings are arranged such that each point within a specified area is included within at least one diamond-shaped ring;

identify a center point for each of the diamond-shaped rings and designate each center point as a connection point; and route a connection between the input terminal and each of plural of the connection points, wherein the pattern comprises an arrangement of diamond-shaped rings such that the center points for the diamond-shaped rings are arranged in a grid, equally spaced in a horizontal direction and equally spaced in a vertical direction.

30. Computer-executable process steps, stored on a computer readable medium, for routing a signal from one of plural connection points to a pin so as to control skew, said process steps comprising steps to:

associate a diamond-shaped ring with each connection point, thereby defining a plurality of diamond-shaped rings, wherein each diamond-shaped ring includes an inner diamond, an outer diamond and all space between the inner diamond and the outer diamond, and wherein the inner diamond and the outer diamond have a common center which is the connection point associated with the diamond-shaped ring;

determine which of the diamond-shaped rings include the pin; and route a connection between the pin and the connection point associated with one of the diamond-shaped rings that includes the pin.

31. An apparatus for pre-wiring a grid of connection points from an input terminal so as to control skew, said apparatus comprising:

a processor for executing stored program instruction steps; and a memory connected to the processor for storing the program instruction steps, wherein the program instruction steps include steps to:
   construct a pattern of diamond-shaped rings, each of the diamond-shaped rings including an inner diamond, an outer diamond and all space between the inner diamond and the outer diamond, wherein the diamond-shaped rings are arranged such that each point within a specified area is included within at least one diamond-shaped ring;
   identify a center point for each of the diamond-shaped rings and designate each center point as a connection point; and
   route a connection between the input terminal and each of plural of the connection points,
wherein the pattern comprises an arrangement of diamond-shaped rings such that the center points for the diamond-shaped rings are arranged in a grid, equally spaced in a horizontal direction and equally spaced in a vertical direction.

32. An apparatus for routing a signal from one of plural connection points to a pin so as to control skew, said apparatus comprising:

a processor for executing stored program instruction steps; and a memory connected to the processor for storing the program instruction steps, wherein the program instruction steps include steps to:
   associate a diamond-shaped ring with each connection point, thereby defining a plurality of diamond-shaped rings, wherein each diamond-shaped ring includes an inner diamond, an outer diamond and all space between the inner diamond and the outer diamond, and wherein the inner diamond and the outer diamond have a common center which is the connection point associated with the diamond-shaped ring;
   determine which of the diamond-shaped rings include the pin; and
   route a connection between the pin and the connection point associated with one of the diamond-shaped rings that includes the pin.

* * * * *